(12) United States Patent
Zhang et al.

(10) Patent No.: US 11,355,572 B2
(45) Date of Patent: Jun. 7, 2022

(54) DISPLAY SUBSTRATE, DISPLAY PANEL, MANUFACTURING METHOD, DRIVING METHOD, AND DISPLAY APPARATUS

(71) Applicant: BOE TECHNOLOGY GROUP CO., LTD., Beijing (CN)

(72) Inventors: Can Zhang, Beijing (CN); Can Wang, Beijing (CN); Han Yue, Beijing (CN); Ming Yang, Beijing (CN); Ning Cong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/176,708

(22) Filed: Oct. 31, 2018

(65) Prior Publication Data

US 2019/0305069 A1 Oct. 3, 2019

(30) Foreign Application Priority Data

Mar. 30, 2018 (CN) .......................... 201810280665.0

(51) Int. Cl.
*H01L 27/32* (2006.01)
*G09G 3/3225* (2016.01)
(Continued)

(52) U.S. Cl.
CPC .......... *H01L 27/3276* (2013.01); *G06F 3/044* (2013.01); *G06F 3/0412* (2013.01);
(Continued)

(58) Field of Classification Search
CPC ............... H01L 27/3276; H01L 27/323; H01L 51/5203; H01L 51/56; H01L 51/5228; H01L 51/0023; H01L 51/0024; H01L 27/3288; G06F 3/0412; G06F 3/044; G06F 3/0416; G06F 2203/04103; G09G 3/3225

See application file for complete search history.

(56) References Cited

U.S. PATENT DOCUMENTS

2006/0273307 A1    12/2006  Wang et al.
2015/0162387 A1*    6/2015  Gu .................... G06F 3/0412
                                                       345/174
(Continued)

FOREIGN PATENT DOCUMENTS

| CN | 101189726 A | 5/2008 |
|---|---|---|
| CN | 106354339 A | 1/2017 |
| CN | 107704129 A | 2/2018 |

OTHER PUBLICATIONS

First Chinese Office Action dated Mar. 19, 2020, received for corresponding Chinese Application No. 201810280665.0, 15 pages.

*Primary Examiner* — Jonathan A Boyd
(74) *Attorney, Agent, or Firm* — Kinney & Lange, P.A.

(57) ABSTRACT

The present disclosure provides a display substrate and a manufacturing method thereof, a display panel and a manufacturing method and a driving method thereof, and a display apparatus. The display substrate includes: a base substrate; and a first electrode, a signal line, and an organic layer between the first electrode and the signal line, all of which are on the base substrate, wherein the display substrate further comprises a conductive pillar configured to penetrate the organic layer and electrically connect the first electrode to the signal line.

18 Claims, 12 Drawing Sheets

(51) Int. Cl.
  *G06F 3/044*  (2006.01)
  *H01L 51/52*  (2006.01)
  *H01L 51/56*  (2006.01)
  *G06F 3/041*  (2006.01)
  *H01L 51/00*  (2006.01)

(52) U.S. Cl.
  CPC ......... *G09G 3/3225* (2013.01); *H01L 27/323* (2013.01); *H01L 51/0023* (2013.01); *H01L 51/5203* (2013.01); *H01L 51/56* (2013.01)

(56)  References Cited

U.S. PATENT DOCUMENTS

| | | | |
|---|---|---|---|
| 2016/0349134 A1* | 12/2016 | Jeon | G01L 1/18 |
| 2017/0045984 A1* | 2/2017 | Lu | H01L 27/1222 |
| 2017/0222059 A1* | 8/2017 | Chen | H01L 27/124 |
| 2017/0349998 A1* | 12/2017 | Yoshinari | C23C 14/06 |
| 2020/0035756 A1 | 1/2020 | Yang et al. | |

* cited by examiner

DISPLAY SUBSTRATE, DISPLAY PANEL, MANUFACTURING METHOD, DRIVING METHOD, AND DISPLAY APPARATUS

CROSS-REFERENCE TO RELATED APPLICATION

This application claims priority to Chinese Patent Application No. 201810280665.0, filed on Mar. 30, 2018, which is herein incorporated by reference in its entirety.

BACKGROUND

The present disclosure generally relates to the field of display technology, and more particularly to a display substrate and a manufacturing method thereof, a display panel and a manufacturing method and a driving method thereof, and a display apparatus.

Organic Light Emitting Diode (OLED) display apparatuses are increasingly applied. In an OLED touch display screen, a multi-use division solution for cathodes may be used. That is, cathodes are divided into a corresponding number of touch electrodes according to a touch resolution. The touch electrodes are used for emitting light in a display phase, and are used for detecting touch in a touch phase.

For a conventional OLED touch display screen process, low light transmittance and a large volume of display apparatuses are urgent problems to be solved currently.

SUMMARY

Embodiments of the present disclosure provide a display substrate and a manufacturing method thereof, a display panel and a manufacturing method and driving method thereof, and a display apparatus.

According to an aspect of the embodiments of the present disclosure, there is provided a display substrate, comprising: a base substrate; and a first electrode, a signal line, and an organic layer between the first electrodes and the signal lines, all of which are on the base substrate, wherein the display substrate further comprises a conductive pillar configured to penetrate the organic layer and electrically connect the first electrode to the signal line.

In an example, the conductive pillar has opposite end faces, and a cross section of the conductive pillar which is parallel to the end faces is rectangular or square.

In an example, a length L of the cross section of the conductive pillar in a width direction of the signal line is equal to a width of the signal line.

In an example, the display substrate is an Organic Light-Emitting Diode (OLED) touch display substrate, which further comprises an anode disposed in the same layer as the signal line and electrically insulated from the signal line, the first electrode is a cathode which serves as a touch electrode, and the signal line serves as a touch signal line.

In an example, material of the conductive pillar comprises Indium Tin Oxide (ITO).

In an example, the display substrate further comprises: a conductive member located on a surface of the first electrode which is away from the organic layer.

In an example, the conductive member comprises an oxidation resistant film and a metal film.

According to another aspect of the embodiments of the present disclosure, there is provided a display panel, comprising the display substrate according to the embodiments of the present disclosure.

In an example, the display panel further comprises: a package cover plate which is connected to the conductive pillar, and is aligned and bonded with the display substrate.

According to another aspect of the embodiments of the present disclosure, there is provided a display apparatus, comprising the display panel according to the embodiments of the present disclosure.

According to another aspect of the embodiments of the present disclosure, there is provided a method for manufacturing a display substrate, comprising: forming a signal line on a base substrate; forming an organic layer on the signal line; forming a first electrode on a surface of the organic layer which is away from the signal line; and forming a conductive pillar, and electrically connecting the first electrode to the signal line by causing the conductive pillar to penetrate the organic layer.

In an example, the method further comprises: forming a second electrode in the same layer as the signal line through a single patterning process, wherein the second electrode is electrically insulated from the signal line.

In an example, forming the conductive pillar comprises: forming a conductive layer; and forming the conductive pillar by etching the conductive layer.

In an example, before forming the conductive layer, forming the conductive pillar further comprises: forming a patterned metal film; and forming an oxidation resistant film which covers the patterned metal film.

In an example, electrically connecting the first electrode to the signal line by causing the conductive pillar to penetrate the organic layer comprises: aligning the conductive pillar with the signal line, and electrically connecting the conductive pillar to the first electrode and the signal line by thermal transfer printing.

According to another aspect of the embodiments of the present disclosure, there is provided a method for manufacturing a display panel, comprising: forming signal lines on a first base substrate; forming an organic layer on the signal line; forming a first electrode on a surface of the organic layer which is away from the signal line; forming a conductive pillar on a second base substrate; and aligning and bonding the first base substrate with the second base substrate by causing the conductive pillar to penetrate the organic layer to electrically connect the first electrode to the signal line.

In an example, the method further comprises: forming a second electrode in the same layer as the signal line through a single patterning process, wherein the second electrode is electrically insulated from the signal line.

In an example, the second base substrate serves as a package cover plate of the display panel.

According to another aspect of the embodiments of the present disclosure, there is provided a method for driving the display panel according to the embodiments of the present disclosure, comprising: inputting, during a display time period within one frame of screen display, a common voltage signal to the first electrode and inputting a data signal to the second electrode; and inputting, during a touch time period within one frame of screen display, a touch scanning signal to the signal line and detecting whether self-capacitance of the first electrode changes.

BRIEF DESCRIPTION OF THE DRAWINGS

In order to more clearly illustrate the embodiments of the present disclosure or the conventional technical solutions, the accompanying drawings to be used in the description of the embodiments will be briefly described below. The accompanying drawings in the following description illustrate only some of the embodiments of the present disclosure. Other embodiments and figures may be obtained by those of ordinary skill in the art according to these accompanying drawings without any creative work.

DETAILED DESCRIPTION

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. The embodiments described in detail herein constitute only a subset of all possible embodiments contemplated by the present disclosure. All other embodiments obtained by those of ordinary skill in the art based on the described embodiments of the present disclosure without contributing any creative work are within the protection scope of the present disclosure. It should be noted that throughout the accompanying drawings, the same elements are represented by the same or similar reference signs. In the following description, some specific embodiments are for illustrative purposes only and are not to be construed as limiting the present disclosure, but merely examples of the embodiments of the present disclosure.

The conventional structure or construction will be omitted when it may cause confusion with the understanding of the present disclosure. It should be noted that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Further, in the description of the embodiments of the present disclosure, the term "connected with" or "connected to" may mean that two components are directly connected, or the two components are connected via one or more other components. In addition, the two components may be connected or coupled by wire or wirelessly.

In an OLED touch display substrate, for example, a full-color OLED light-emitting layer is usually formed by using a Fine Metal Mask (FMM), and other OLED organic functional layers are formed by using an open mask. Due to the barrier of the OLED organic functional layers in a display region, a cathode material on one side of the organic functional layers is difficult to be connected to a metal layer on the other side of the organic functional layers.

Figure 1A:
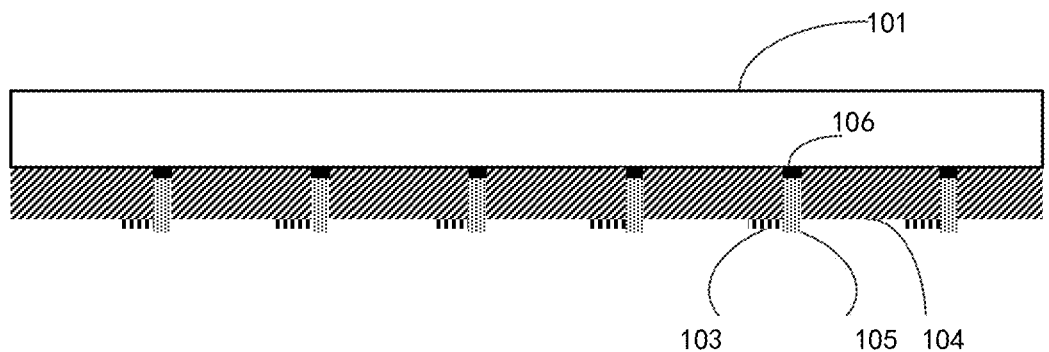
FIG. 1A illustrates a schematic cross-sectional view of a display substrate according to an embodiment of the present disclosure.

According to an embodiment of the present disclosure, there is provided a display substrate. FIG. 1A illustrates a schematic cross-sectional view of a display substrate 10 according to an embodiment of the present disclosure.

As shown in FIG. 1A, the display substrate 10 according to the embodiment of the present disclosure may comprise a base substrate 101. The display substrate 10 may further comprise first electrodes 103, signal lines 106, and an organic layer 104 between the first electrodes 103 and the signal lines 106 on the base substrate 101. As shown in FIG. 1A, each of the first electrodes 103 is electrically connected to a corresponding signal line 106 via a conductive pillar 105 which penetrates the organic layer 104.

Those skilled in the art should understand that, although FIG. 1A and subsequent drawings have shown a certain number (e.g. 6 as shown in FIG. 1A) of first electrodes, signal lines and conductive pillars, this is only exemplary. The present disclosure have no limit in this respect. In other embodiments, more or less first electrodes, signal lines and conductive pillars may be provided.

According to an embodiment of the present disclosure, the display substrate 10 may comprise first electrodes 103, signal lines 106, and an organic layer 104 between the first electrodes 103 and the signal lines 106 on the base substrate 101. Each of the first electrodes 103 is electrically connected to a corresponding signal line 106 via a conductive pillar 105 which penetrates the organic layer 104, and thereby the first electrodes 103 may easily be connected to the signal lines 106. According to an embodiment of the present disclosure, a display time of each frame image of the display substrate may be divided into a display time period and a touch time period. The first electrodes 103 may serve as touch electrodes during the touch time period of the display substrate. Thereby, during the display time period, for example, a common voltage signal Vcom may be loaded to the first electrodes 103, so that screen display is performed by the display substrate. During the touch time period, a touch scanning signal may be loaded to the first electrodes 103, and the first electrodes 103 serve as touch electrodes to realize collection of touch position information, thereby achieving the purpose of touch control. For example, the first electrodes 103 may be cathodes in an OLED display substrate.

Figure 1B:
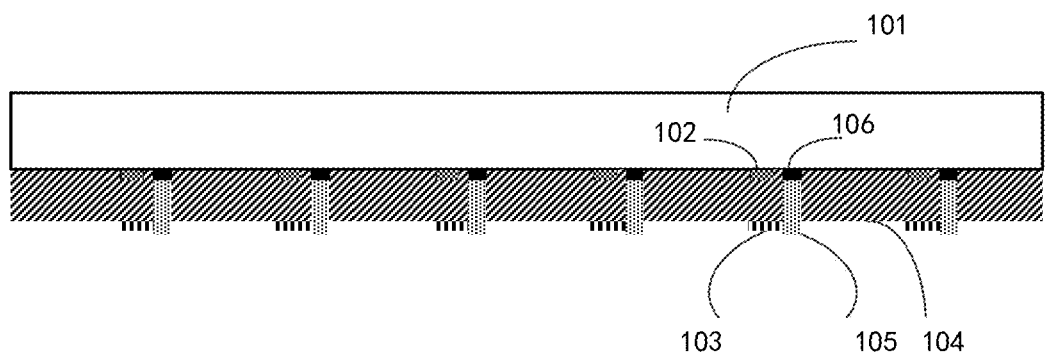
FIG. 1B illustrates a schematic cross-sectional view of a display substrate according to another embodiment of the present disclosure.

FIG. 1B illustrates a schematic cross-sectional view of a display substrate 10' according to another embodiment of the present disclosure. As shown in FIG. 1B, the display substrate 10' according to the embodiment of the present disclosure may comprise a base substrate 101, and first electrodes 103, signal lines 106, and an organic layer 104 between the first electrodes 103 and the signal lines 106 on the base substrate 101. Each of the first electrodes 103 is electrically connected to a corresponding signal line 106 via a conductive pillar 105 which penetrates the organic layer 104. As shown in FIG. 1B, the display substrate 10' may be an OLED touch display substrate, and the OLED touch display substrate 10' further comprises anodes 102 disposed in the same layer as the signal lines 106 and electrically insulated from the signal lines 106. According to an embodiment of the present disclosure, the first electrodes 103 may be cathodes which further serve as touch electrodes, and the signal lines 106 may be touch signal lines.

The signal lines 106 may be touch signal lines through which a touch scanning signal is loaded to the respective cathodes 103 during the touch time period of the display substrate. It can be understood by those skilled in the art that the embodiments of the present disclosure are not limited thereto. The signal lines 106 may also serve to apply a common voltage to the respective cathodes during the display time period of the display substrate.

For example, the conductive pillars 105 each may be a pillar having a rectangular or a square cross section. A length of the cross section of each of the signal lines 106, which is perpendicular to an extending direction thereof, in a direction parallel to the base substrate 101 may be referred to as a width of the signal line 106. A length of the conductive pillars 105 in the width direction of the signal line 106 may be equal to the width of the signal line 106. Further, a height of the conductive pillars 105 in a direction perpendicular to the base substrate 101 may be greater than or equal to a thickness of the organic layer 104, thereby achieving an effective electrical connection between the first electrodes 103 and the signal lines 106.

It can be understood by those skilled in the art that the term "equal" as used in the present disclosure may cover cases where there is a certain error due to precision limitations in a process, for example, there may be an allowable error within a certain range (for example, ±10%.)

For example, according to an embodiment of the present disclosure, the conductive pillars 105 may be formed of a transparent conductive material such as Indium Tin Oxide (ITO).

Each of the first electrodes 103 may comprise a plurality of sub-electrodes which are independent of each other according to a touch resolution of the display substrate. For example, the first electrode may be divided into a plurality of sub-electrodes which are insulated from each other by spacers of a negative photosensitive material. The plurality of sub-electrodes may be electrically connected to respective signal lines via respective conductive pillars respectively.

According to an embodiment of the present disclosure, the base substrate 101 may be a monocrystalline silicon or a polycrystalline silicon substrate. The display substrate 10 or the display substrate 10' may further comprise an array circuit layer formed on the base substrate 101. The array circuit layer may comprise a thin film transistor array to control light-emitting of corresponding pixel units.

According to an embodiment of the present disclosure, the signal lines 106 may be disposed in the same layer as the second electrodes (anodes) 102. The signal lines 106 and the second electrodes 102 may be electrically insulated from each other. For example, the signal lines 106 may be formed in the same layer as a gate metal layer in the array circuit layer of the display substrate, and are located in the same layer as gate lines and gates of the display substrate. Alternatively, the signal lines 106 may be formed using a source/drain metal layer of the display substrate, and are located in the same layer as sources, drains, and data lines of the display substrate. Extending directions of the signal lines connected to the first electrodes (or sub-electrodes) 103 may be parallel to each other, and various first electrodes or sub-electrodes may also have the same shape and size, which ensures that various first electrodes have consistent touch sensing sensitivity, thereby improving the uniformity of touch sensing.

For example, from a side of the second electrodes to a side of the first electrodes, the organic layer may sequentially comprise a hole injection layer, a hole transport layer, an organic light-emitting layer, an electron transport layer, and an electron injection layer. In order to simplify the description of the embodiments of the present disclosure, the organic layer will not be described in detail here.

Figure 2A:
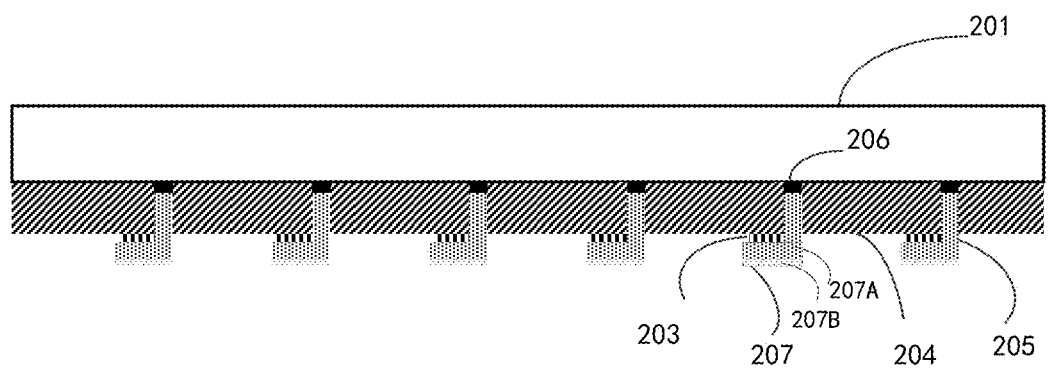
FIG. 2A illustrates a schematic cross-sectional view of a display substrate according to yet another embodiment of the present disclosure.

FIG. 2A illustrates a schematic cross-sectional view of a display substrate according to another embodiment of the present disclosure. As shown in FIG. 2A, the display substrate 20 according to the embodiment of the present disclosure may comprise a base substrate 201. The display substrate 20 may further comprise first electrodes 203, signal lines 206, and an organic layer 204 between the first electrodes 203 and the signal lines 206 on the base substrate 201. As shown in FIG. 2A, the display substrate 20 may further comprise conductive members 207 on one side of the first electrodes 203 which is away from the organic layer 204. Each of the first electrodes 203 is electrically connected to a corresponding signal line 206 via a conductive pillar 205 and a corresponding conductive member 207. For example, the conductive member 207 is in electrical contact with the conductive pillar 205, which substantially increases an electrical contact area of the first electrode 203 with the conductive pillar 205, thereby improving the electrical connectivity between the first electrode 203 and the signal line 206.

For example, the conductive member 207 may comprise an oxidation resistant film 207A and a metal film 207B. For example, the oxidation resistant film 207A and the metal film 207B may be sequentially formed on one side of the first electrode 203 which is away from the organic layer 204. The oxidation resistant film 207A may be formed using the same material, for example, ITO, as that of the conductive pillar 205. The metal film 207B may be formed using, for example, silver or AgMg alloy.

Figure 2B:
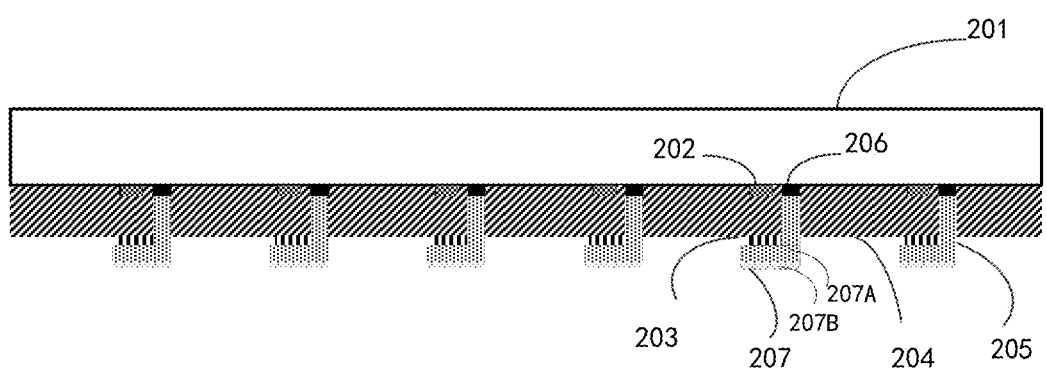
FIG. 2B illustrates a schematic cross-sectional view of a display substrate according to a further embodiment of the present disclosure.

FIG. 2B illustrates a schematic cross-sectional view of a display substrate according to another embodiment of the present disclosure. As shown in FIG. 2B, the difference from the display substrate 20 shown in FIG. 2A is that the display substrate 20' according to the other embodiment of the present disclosure may further comprise second electrodes 202. Further, the base substrate 201, the first electrodes 203, the signal lines 206, the organic layer 204, and the conductive members 207 of the display substrate 20' are similar to the base substrate 201, the first electrodes 203, the signal lines 206, the organic layer 204 and the conductive members 207 in FIG. 2A, and will not be described in detail here.

Figure 3A:
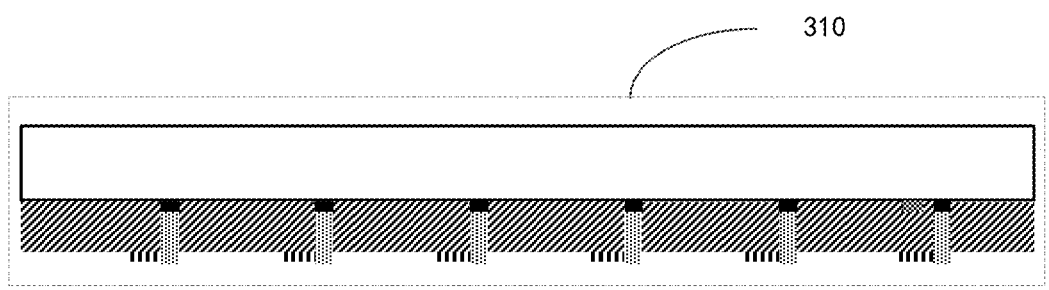
FIG. 3A illustrates a schematic view of a display panel according to an embodiment of the present disclosure.

According to another aspect of the embodiments of the present disclosure, there is provided a display panel. FIG. 3A illustrates a schematic view of a display panel according to one embodiment of the present disclosure. As shown in FIG. 3A, the display panel 300 according to the embodiment of the present disclosure may comprise a display substrate 310 according to an embodiment of the present disclosure.

Figure 3B:
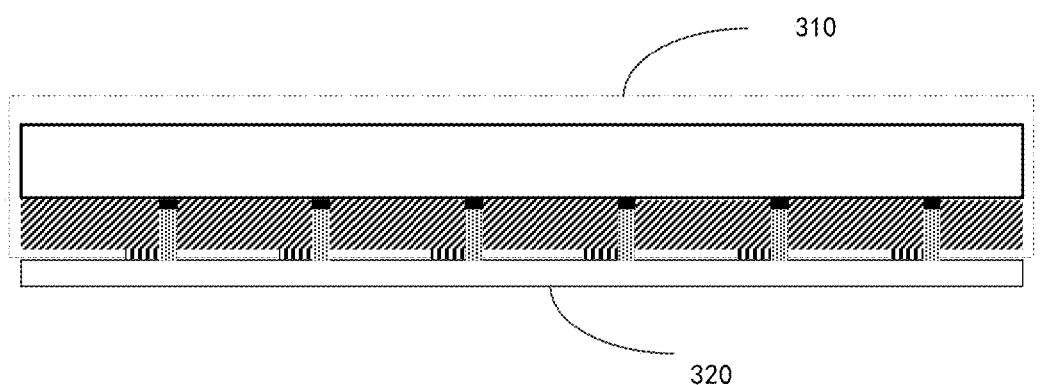
FIG. 3B illustrates a schematic view of a display panel according to another embodiment of the present disclosure.

FIG. 3B illustrates a schematic view of a display panel according to another embodiment of the present disclosure.

As shown in FIG. 3B, the display panel 300' comprises the display substrate 310. The display panel 300' further comprises a package cover plate 320. For example, conductive pillars may be formed on the package cover plate, and the package cover plate is aligned and bonded with the display substrate when the conductive pillars penetrate the organic layer.

For example, the package cover plate 320 according to the embodiment of the present disclosure may be a glass substrate. It can be understood by those skilled in the art that the package cover plate 320 may be a base substrate used in a process of forming the conductive pillars or may also be an additional substrate, which is not limited in the present disclosure.

According to yet another aspect of the embodiments of the present disclosure, there is provided a method for manufacturing a display substrate. It should be illustrated that serial numbers of various steps in the following method are only used as a representation of the steps for convenience of description, and should not be regarded as indicating an execution order of the various steps. This method does not need to be performed exactly in an order as illustrated, unless explicitly stated.

Figure 4:
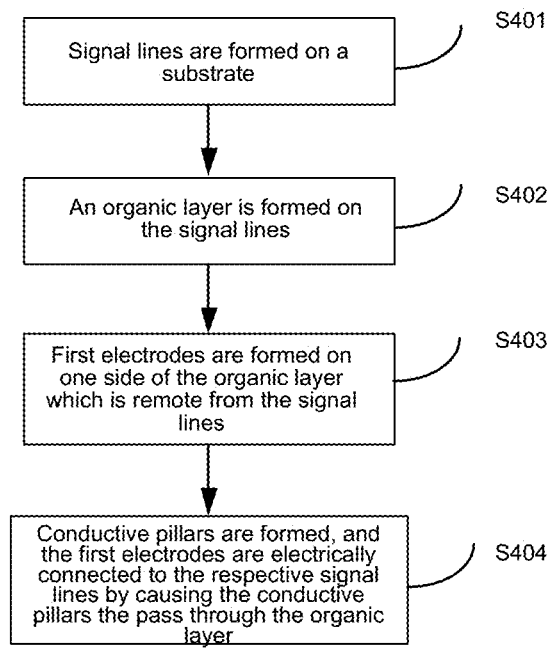
FIG. 4 illustrates a schematic flowchart of a method for manufacturing a display substrate according to an embodiment of the present disclosure.

As shown in FIG. 4, a method 40 for manufacturing a display substrate according to an embodiment of the present disclosure may comprise the following steps.

In step S401, signal lines are formed on a base substrate.

In step S402, an organic layer is formed on the signal lines.

In step S403, first electrodes are formed on one side of the organic layer which is away from the signal lines.

In step S404, conductive pillars are formed, and the first electrodes are electrically connected to the respective signal lines by causing the conductive pillars the penetrate the organic layer.

FIGS. 5A-5I are schematic views illustrating processes of manufacturing a display substrate according to an embodiment of the present disclosure respectively. Hereinafter, the method for manufacturing a display substrate according to the embodiment of the present disclosure will be described in detail with reference to FIG. 4 and FIGS. 5A-5I.

Figure 5A:
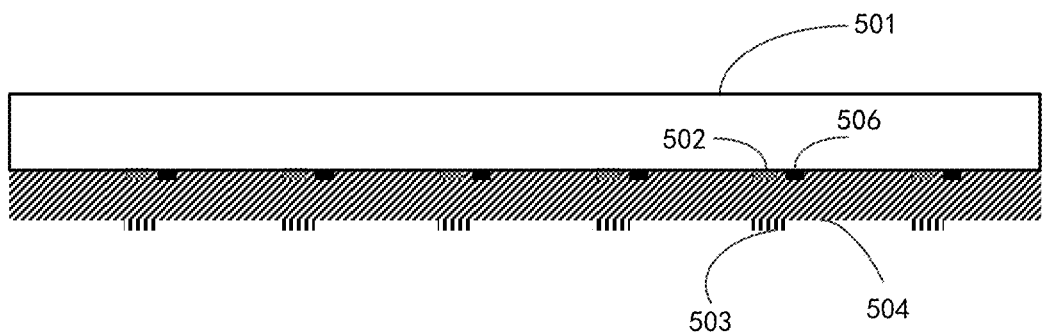
FIGS. 5A-5I are schematic views illustrating processes of manufacturing a display substrate according to an embodiment of the present disclosure respectively.

As shown in FIG. 5A, signal lines 506 are formed on a base substrate 501. Next, an organic layer 504 is formed on the signal lines 506. Then, second electrodes 503 are formed on one side of the organic layer 504 which is away from the signal lines 506. The structure shown in FIG. 5A may be referred to as a "mother substrate." In addition, the second electrodes 502 may be formed in the same layer as the signal lines 506 through a single patterning process, and the second electrodes 502 are electrically insulated from the signal lines 506.

It can be understood by those skilled in the art that the present disclosure does not limit specific processes of manufacturing the base substrate 501, the first electrodes 503, the second electrodes 502, the organic layer 504, and the signal lines 506. Further, according to the manufacturing method according to the present disclosure, an order in which the processes are completed is not limited, for example, the "mother substrate" portion may also be manufactured after the conductive pillars are manufactured.

Figure 5B:
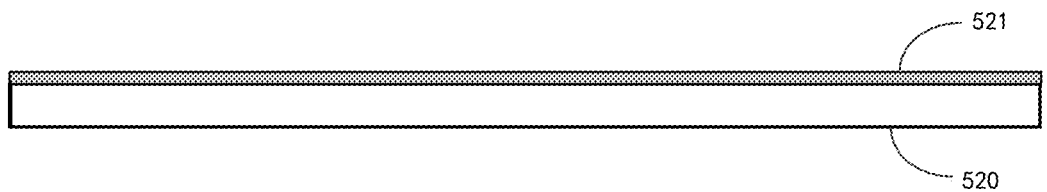

As shown in FIG. 5B, an inorganic film 521 is then deposited on a base substrate 520 of, for example, glass. For example, the inorganic film 521 may be deposited by sputtering or Plasma Chemical Vapor Deposition (PECVD). Since high-temperature evaporation at a temperature of more than 1500° C. is required in subsequent processes, the inorganic film 521 may be formed using a high temperature resistant material such as $TiO_2$, $SiN_2$, $SiO_2$ etc. The inorganic film 521 may be formed to have a thickness of 100 nm to 500 nm. The inorganic film 521 corresponds to a buffer layer and may be used for flattening. Further, the inorganic film 521 may be used to prevent the base substrate 520 from being transferred to the mother substrate in the subsequent processes.

It can be understood by those skilled in the art that numerical values related to sizes, temperatures, etc. in the embodiments of the present disclosure are merely examples, and other numerical values may, of course, also be used depending on practical applications. In addition, the numerical values mentioned in the embodiments of the present disclosure are not completely accurate, and there may be an allowable error within a certain range (for example, ±20%.)

Figure 5C:
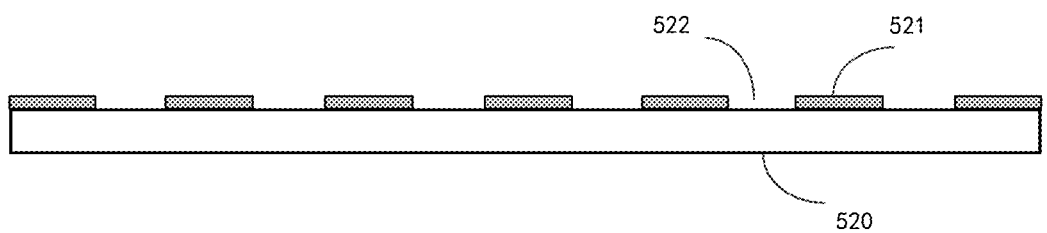

Next, as shown in FIG. 5C, the inorganic film 521 on the second base substrate 520 is patterned by, for example, an etching process to form openings 522. The openings 522 have a size consistent with that of pixel units.

Figure 5D:
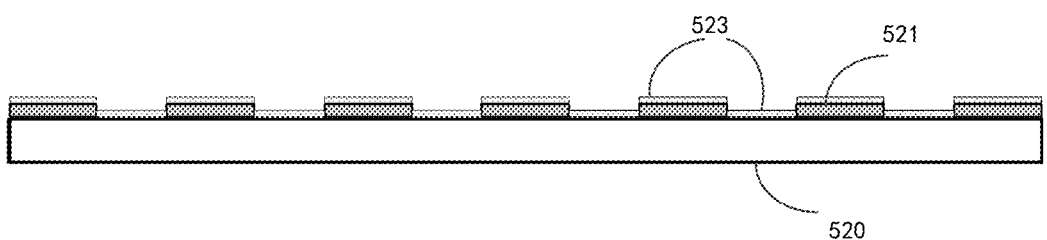

Next, as shown in FIG. 5D, a metal film 523 is deposited within a region of the entire second base substrate. This metal film 523 is used for a transfer printing process in the subsequent processes, and therefore the metal film 523 is required to have a low transfer temperature to be easily transfer printed to, for example, the first base substrate portion. Therefore, for example, the metal film 523 may be a silver (Ag) film or a MgAg alloy film. The metal film 523 may have a thickness of 10 nm to 20 nm.

Figure 5E:
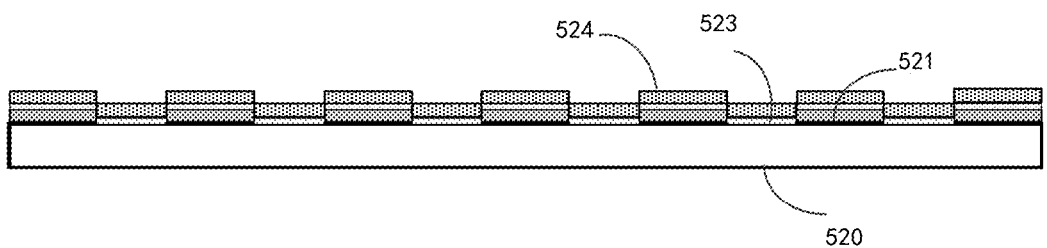

Next, as shown in FIG. 5E, an oxidation resistant film 524 is deposited on the metal film 523 to prevent oxidation of the metal film 523. The oxidation resistant film 524 may have a thickness of, for example, 100 nm. For example, the oxidation resistant film 524 may be formed on the metal film 523 by a process such as evaporation or sputtering etc. In consideration of the subsequent processes, the oxidation resistant film 524 may be formed using the same material (for example, ITO) as that of the conductive pillars.

Figure 5F:
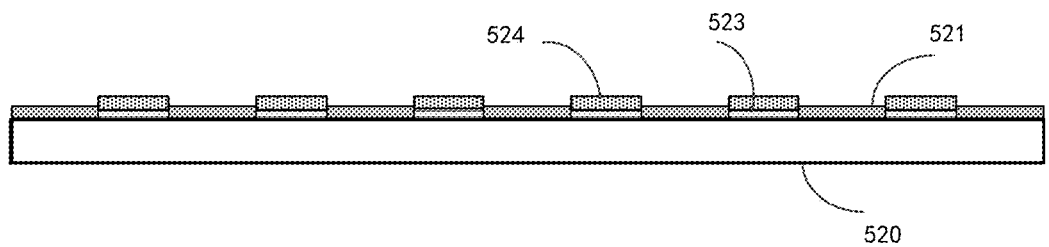

Next, as shown in FIG. 5F, the metal film 523 and the oxidation resistant film 524 corresponding to the patterned inorganic film 521 shown in FIG. 5C are etched away, that is, portions of the metal film 523 and the oxidation resistant film 524 which correspond to the openings 522 are retained. It can be understood by those skilled in the art that the patterned metal film 523 and oxidation resistant film 524 shown in FIG. 5F may correspond to the metal film 207B and the oxidation resistant film 207A in FIGS. 2A and 2B, respectively.

Figure 5G:
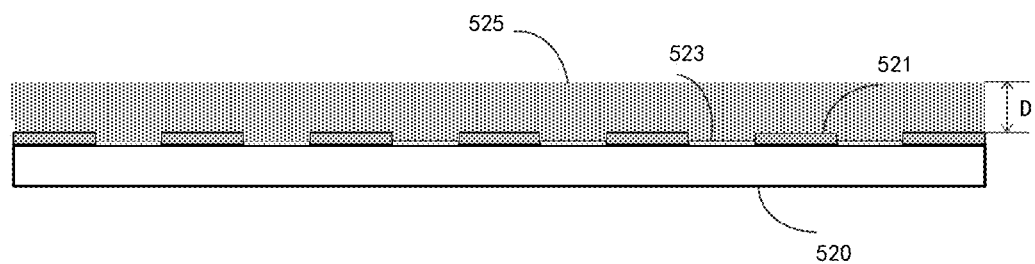

Next, as shown in FIG. 5G, a conductive material layer 525 is deposited within the region of the entire second base substrate. The conductive material layer 525 has a thickness D consistent with, for example, those of the organic layer 104 in FIG. 1A and the organic layer 104 in FIG. 1B. It can be understood by those skilled in the art that the thickness D of the conductive material layer 525 is not uniform throughout the region of the entire base substrate, wherein a thickness of the conductive material layer 525 within a region where the oxidation resistant film 524 is formed is less than a thickness of the conductive material layer 525 within a region without the oxidation resistant film 524. In general, the conductive material layer 525 is formed to have a flat top surface and have a thickness equal to or slightly greater (a thickness of the first electrodes 103+a thickness of the organic layer 104.)

Figure 5H:
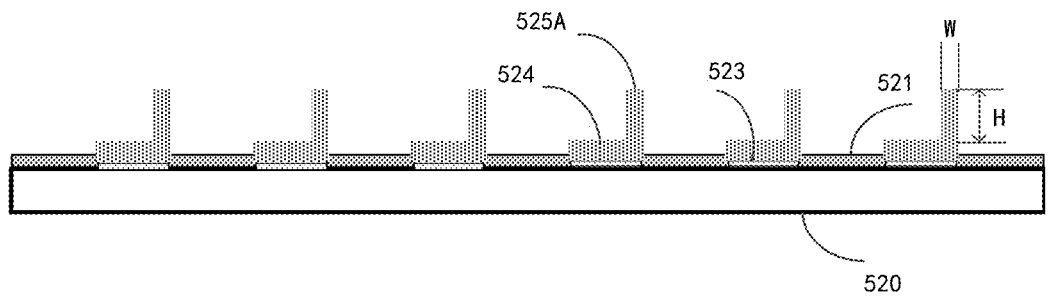

Next, as shown in FIG. 5H, conductive pillars 525A are formed by etching the conductive material layer 525. Further, in a process of forming the conductive pillars 525A by etching the conductive material layer 525, the oxidation resistant film 524 may be retained. The conductive pillars 525A have a height H equal to or slightly greater than (the thickness of the first electrodes 103+the thickness of the organic layer 104.)

The conductive pillars 525A may be formed into a cylinder having a rectangular or square cross section. A length L of the cross section of each of the conductive pillars in a width direction of the signal lines may be equal to a width of the signal lines, for example, 2 um to 10 um.

Figure 5I:
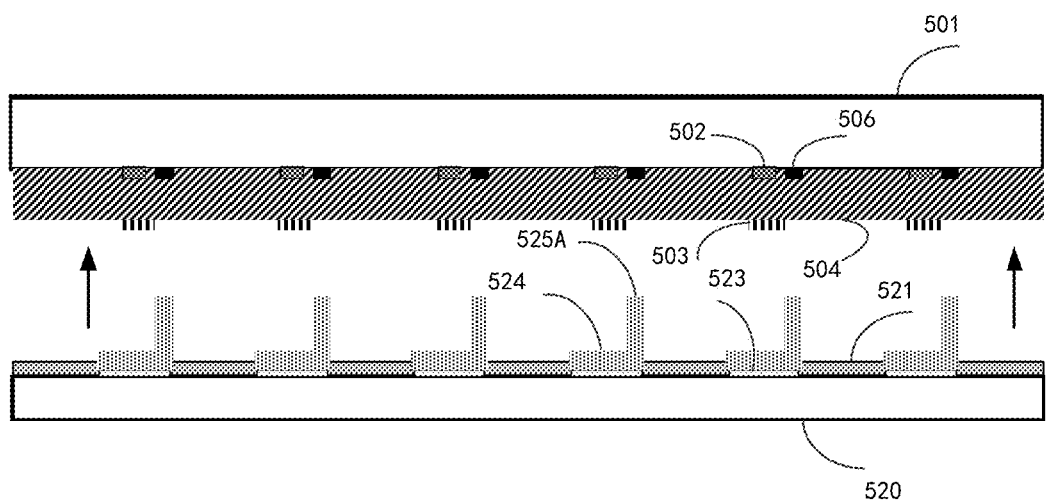

The structure obtained as shown in FIG. 5H may be referred to as a "seed substrate." Next, as shown in FIG. 5I, the conductive pillars 525A penetrate the organic layer 504 in a direction indicated by arrows and are electrically connected to the respective signal lines 506, thereby providing electrical connection between the first electrodes 503 and the signal lines 506.

According to a further aspect of the embodiments of the present disclosure, there is provided a method for manufacturing a display substrate. It should be illustrated that serial numbers of various steps in the following method are only used as a representation of the steps for convenience of description, and should not be regarded as indicating an execution order of the various steps. This method does not need to be performed exactly in an order as illustrated, unless explicitly stated.

Figure 6:
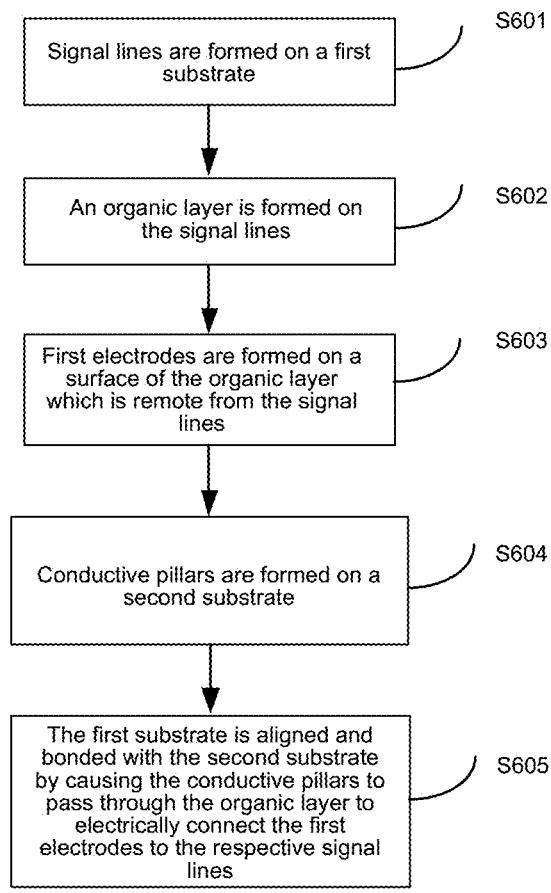
FIG. 6 illustrates a schematic flowchart of a method for manufacturing a display panel according to an embodiment of the present disclosure.

As shown in FIG. 6, a method 60 for manufacturing a display panel according to an embodiment of the present disclosure may comprise the following steps.

In step S601, signal lines are formed on a first base substrate.

In step S602, an organic layer is formed on the signal lines.

In step S603, first electrodes are formed on a surface of the organic layer which is away from the signal lines.

In step S604, conductive pillars are formed on a second base substrate.

In step S605, the first base substrate is aligned and bonded with the second base substrate by causing the conductive pillars to penetrate the organic layer to electrically connect the first electrodes to the respective signal lines.

Thereby, the second base substrate serves as a package cover plate of the produced display panel.

FIGS. 7A-7J are cross-sectional views illustrating processes of manufacturing a display panel according to an embodiment of the present disclosure respectively. Next, the method for manufacturing a display panel according to the embodiment of the present disclosure will be described in detail with reference to FIG. 6 and FIGS. 7A-7J.

Figure 7A:
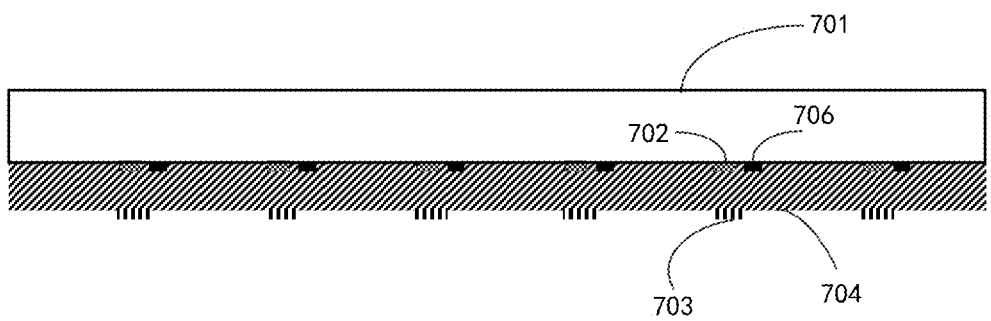
FIGS. 7A-7J are schematic views illustrating processes of manufacturing a display panel according to an embodiment of the present disclosure respectively.

As shown in FIG. 7A, signal lines 706 are formed on a first base substrate 701. Next, an organic layer 704 is formed on the signal lines 706. Then, second electrodes 703 are formed on one side of the organic layer 704 which is away from the signal lines 706. Similarly to FIG. 5A, the structure shown in FIG. 7A may be referred to as a "mother substrate." In addition, second electrodes 702 may be formed in the same layer as the signal lines 706 through a single patterning process, and the second electrodes 702 are electrically insulated from the signal lines 706.

Figure 7B:
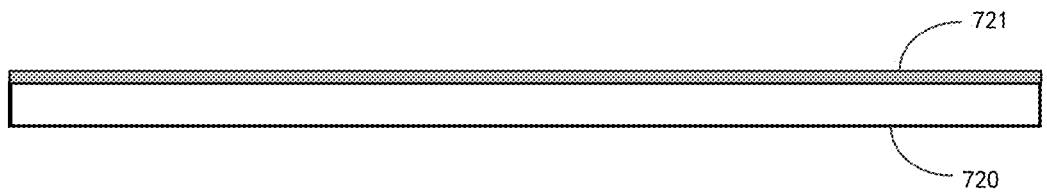

As shown in FIG. 7B, an inorganic film 721 is then deposited on a second base substrate 720 of, for example, glass. A process of manufacturing the inorganic film 721 is similar to the process of manufacturing the inorganic film 521 in FIG. 5A, and will not be described in detail here. For example, glass may be used as the second base substrate 720. According to an embodiment of the present disclosure, the second base substrate 720 may be used as a package substrate of the display panel according to the embodiment of the present disclosure.

Figure 7C:
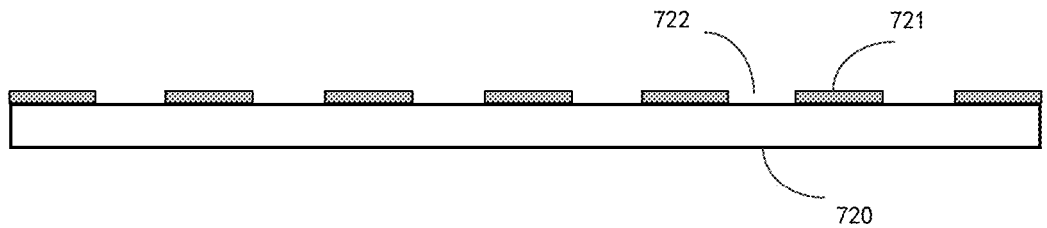

Next, as shown in FIG. 7C, the inorganic film 521 is patterned to form openings 722.

Figure 7D:
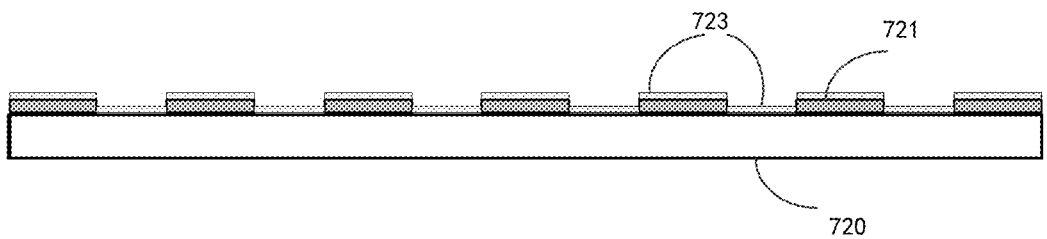

Then, as shown in FIG. 7D, a metal film 723 is deposited within a region of the entire second base substrate. A process of manufacturing the metal film 723 is similar to the process of manufacturing the metal film 523 in FIG. 5A, and will not be described in detail here.

Figure 7E:
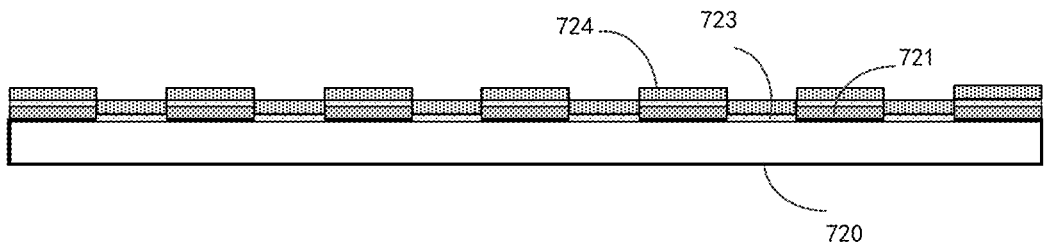

Next, as shown in FIG. 7E, an oxidation resistant film 724 is deposited on the metal film 723 to prevent oxidation of the metal film 723. A process of manufacturing the oxidation resistant film 724 is similar to the process of manufacturing the oxidation resistant film 524 in FIG. 5A, and will not be described in detail here.

Figure 7F:
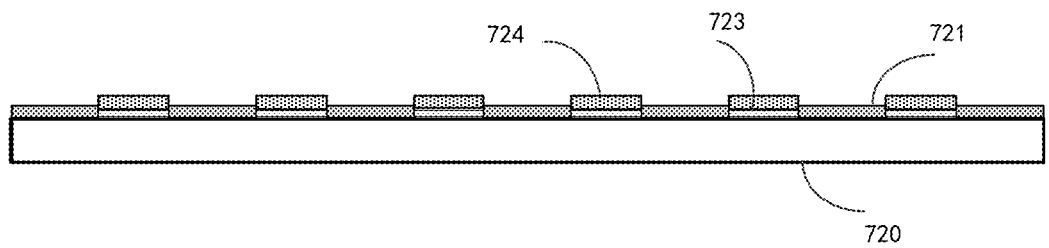

Next, as shown in FIG. 7F, the metal film 723 and the oxidation resistant film 724 which correspond to the patterned inorganic film 721 shown in FIG. 7C are etched away, that is, portions of the metal film 723 and the oxidation resistant film 724 which correspond to the openings 722 are retained. It can be understood by those skilled in the art that the patterned metal film 723 and oxidation resistant film 724 shown in FIG. 7F may correspond to the metal film 207B and the oxidation resistant film 207A in FIGS. 2A and 2B, respectively.

Figure 7G:
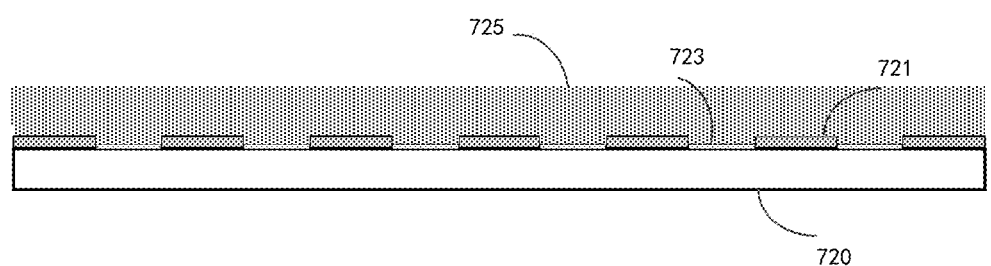

Then, as shown in FIG. 7G, a conductive material layer 725 is deposited within the region of the entire second base substrate. A process of manufacturing the conductive material layer 725 is similar to the process of manufacturing the conductive material layer 525 in FIG. 5A, and will not be described in detail here.

Figure 7H:
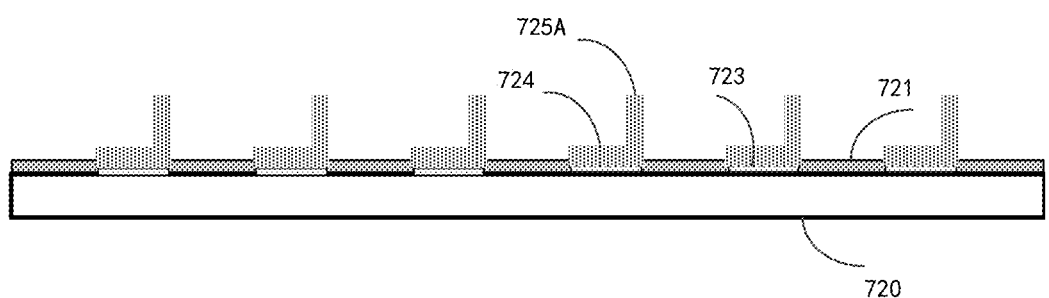

Next, as shown in FIG. 7H, conductive pillars 725A are formed by etching the conductive material layer 725. The structure obtained as shown in FIG. 7H may be referred to as a "seed substrate."

Figure 7I:
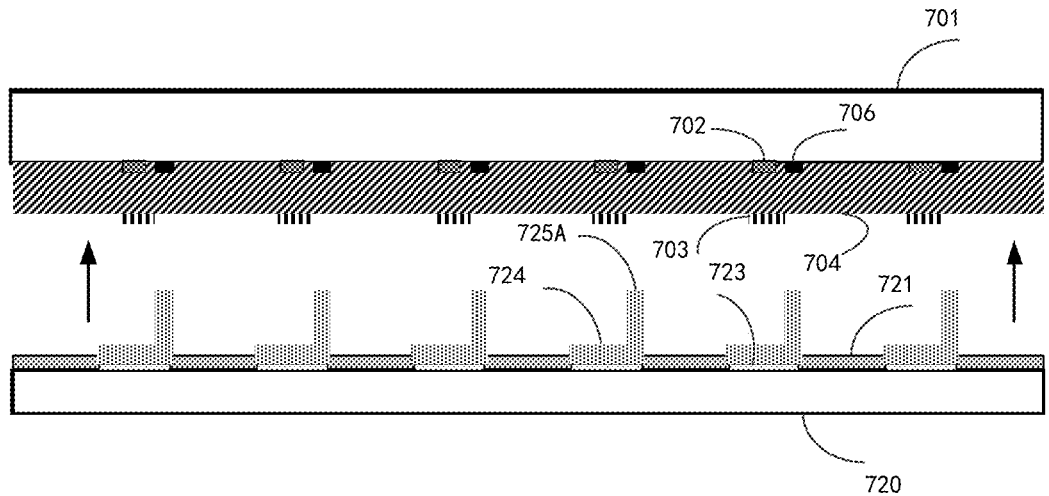

Then, as shown in FIG. 7I, the conductive pillars 725A penetrate the organic layer 704 in a direction indicated by arrows and are electrically connected to the respective signal lines 706, thereby providing electrical connection between the first electrodes 703 and the signal lines 706.

Figure 7J:
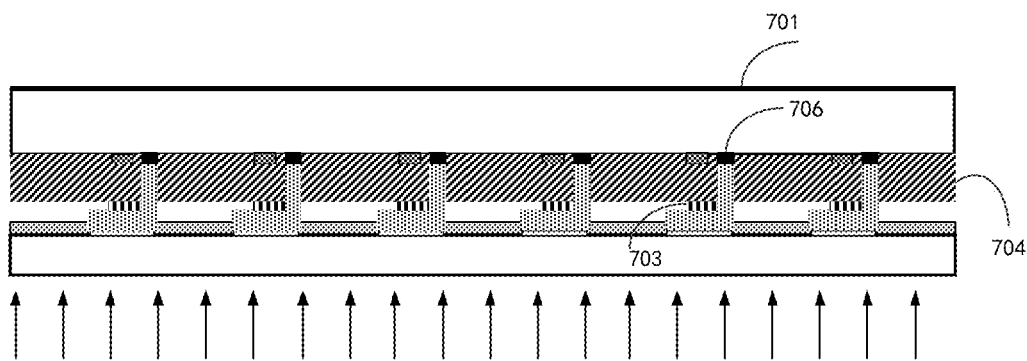

In addition, as shown in FIG. 7J, the conductive pillars 725A on the seed substrate are aligned with the signal lines 706 on the mother substrate to achieve accurate alignment between the mother substrate and the seed substrate. Then, the two substrates are bonded, so that a distance therebetween is less than, for example, 10 um. For example, thermal energy or laser may be applied to the seed substrate using a thermal transfer printing process in the direction indicated by the arrows to transfer the metal film 723 and the oxidation resistant film 724 on the seed substrate to the mother substrate. At the same time, the conductive pillars 725A penetrate the organic layer 504.

Figure 8:
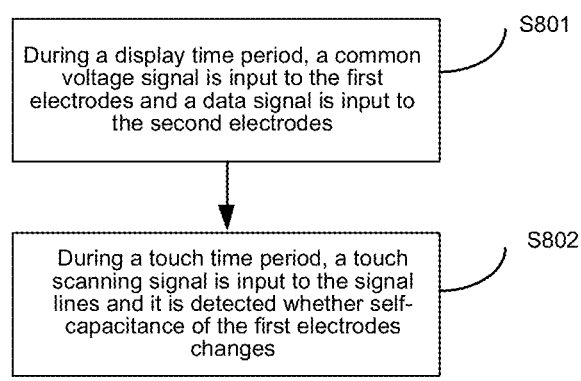
FIG. 8 illustrates a schematic flowchart of a method for driving a display panel according to an embodiment of the present disclosure.

According to another aspect of the embodiments of the present disclosure, there is provided a method for driving a display panel, which is used to drive the display panel according to the embodiment of the present disclosure. As shown in FIG. 8, the method 80 for driving a display panel according to the embodiment of the present disclosure may comprise the following steps.

In step S801, during a display time period within one frame of screen display, a common voltage signal is input to the first electrodes and a data signal is input to the second electrodes.

In step S802, during a touch time period within one frame of screen display, a touch scanning signal is input to the signal lines and it is detected whether self-capacitance of the first electrodes changes.

According to an embodiment of the present disclosure, the first electrodes of the display panel are electrically connected to the respective signal lines through the conductive pillars. A display time of each frame image of an OLED touch display substrate may be divided into a display time period and a touch time period. During the display time period, a common voltage signal may be applied to the first electrodes and a data signal may be input to the second electrodes, so that screen display is performed by an OLED touch display panel. During the touch time period, a touch scanning signal is applied to the first electrodes via touch signal lines, the first electrodes serve as touch electrodes, and collection of touch position information is realized by detecting whether the self-capacitance of the first electrodes changes, to enables touch control.

Further, during the display time period, the first electrodes and the second electrodes may drive the organic layer to emit white light under the control of the display driving signal. Color display may be achieved by providing a color filter on the package cover plate.

Figure 9:
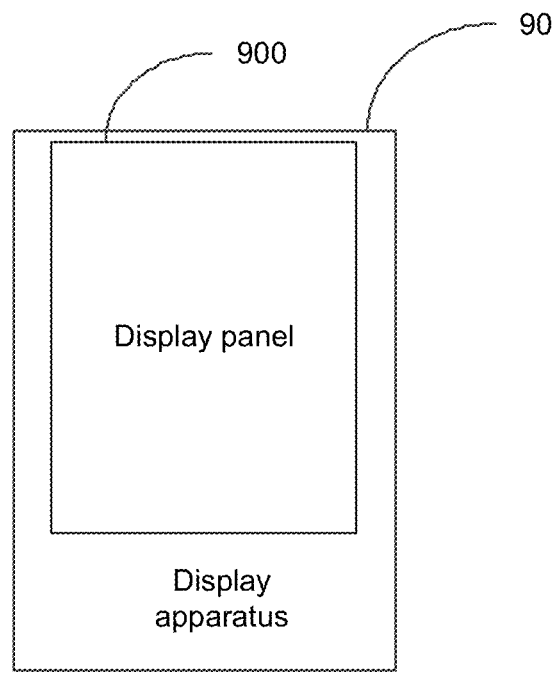
FIG. 9 is a schematic diagram of a display apparatus according to an embodiment of the present disclosure.

According to another aspect of the present disclosure, there is further provided a display apparatus. FIG. 9 illustrates a display apparatus 90 according to an embodiment of the present disclosure. As shown in FIG. 9, the display apparatus 90 according to the embodiment of the present disclosure may comprise a display panel 900 according to an embodiment of the present disclosure. The display apparatus 90 according to the embodiment of the present disclosure may be any product or component having a display function such as an electronic paper, a mobile phone, a tablet computer, a television, a display, a notebook computer, a digital photo frame, a navigator, etc.

It can be understood that the above embodiments are merely exemplary embodiments used to explain the principles of the present disclosure, but the present disclosure is not limited thereto. Various modifications and improvements can be made by those skilled in the art without departing from the spirit and substance of the present disclosure, and such modifications and improvements are also considered to be within the protection scope of the present disclosure.

The invention claimed is:

1. A display panel of an OLED display, comprising;
an OLED display substrate, comprising:
a first base substrate;
a first electrode, an organic layer, and a signal line that are stacked on the first base substrate vertically, an oxidation resistant film and a metal film being sequentially formed on a first side of the first electrode which is away from the organic layer, the first electrode being a cathode of the OLED display substrate, and
a second base substrate formed at a side of the first electrode away from the first base substrate, having a conductive pillar formed thereon, wherein the conductive pillar penetrates the organic layer and electrically connects to the signal line, the conductive pillar and the oxidation resistant film form an L-shaped member and the L-shaped member has a first surface parallel to the first base substrate and a second surface perpendicular to the first base substrate, and the L-shaped member contacts the first electrode at both the first and second surfaces, to connect the first electrode to the signal line, wherein an orthographic projection of the oxidation resistant film on the first base substrate overlaps with an orthographic projection of the conductive pillar on the first base substrate and with an orthographic projection of the first electrode on the first base substrate.

2. The OLED display panel according to claim 1, wherein the second base substrate serves as a package cover plate of the display panel.

3. A display apparatus, comprising the display panel according to claim 2.

4. The display panel according to claim 1, wherein the conductive pillar has opposite end faces, and a cross section of the conductive pillar which is parallel to the end faces is rectangular or square.

5. The display panel according to claim 1, wherein the conductive pillar has opposite end faces, and a length L of a cross section of the conductive pillar which is parallel to the end faces in a width direction of the signal line is equal to a width of the signal line.

6. The display panel according to claim 4, wherein a length L of the cross section of the conductive pillar in a width direction of the signal line is equal to a width of the signal line.

7. The display panel according to claim 1, wherein the display substrate is an Organic Light-Emitting Diode (OLED) touch display substrate, which further comprises an anode disposed in the same layer as the signal line and electrically insulated from the signal line, the first electrode is a cathode which serves as a touch electrode, and the signal line serves as a touch signal line.

8. The display panel according to claim 1, wherein material of the conductive pillar comprises Indium Tin Oxide (ITO).

9. The display panel according to claim 1, further comprising: a conductive member located on a surface of the first electrode which is away from the organic layer.

10. The display panel according to claim 9, wherein the conductive member comprises an oxidation resistant film and a metal film.

11. A method for manufacturing an OLED display substrate, comprising:
forming a signal line on a first base substrate;
forming an organic layer on the signal line;
forming a first electrode on a surface of the organic layer which is away from the signal line;
sequentially forming an oxidation resistant film and a metal film on a first side of the first electrode which is away from the organic layer, the first electrode being a cathode of the OLED display substrate; and
forming a conductive pillar on a second base substrate, and electrically connecting the first electrode to the signal line by causing the conductive pillar to penetrate the organic layer, wherein the conductive pillar and the oxidation resistant film form an L-shaped member, the L-shaped member has a first surface parallel to the first base substrate and a second surface perpendicular to the first base substrate, and the L-shaped member contacts the first electrode at both the first and second surfaces, wherein an orthographic projection of the oxidation resistant film on the first substrate overlaps with an orthographic projection of the conductive pillar on the first base substrate and with an orthographic projection of the first electrode on the first base substrate.

12. The method according to claim 11, further comprising;
   forming a second electrode in the same layer as the signal line through a single patterning process, wherein the second electrode is electrically insulated from the signal line.

13. The method according to claim 11, wherein forming the conductive pillar comprises:
   forming a conductive layer; and
   forming the conductive pillar by etching the conductive layer.

14. The method according to claim 13, wherein before forming the conductive layer, forming the conductive pillar further comprises:
   forming a patterned metal film; and
   forming an oxidation resistant film which covers the patterned metal film.

15. The method according to claim 14, wherein electrically connecting the first electrode to the signal line by causing the conductive pillar to penetrate the organic layer comprises:
   aligning the conductive pillar with the signal line, and electrically connecting the conductive pillar to the first electrode and the signal line by thermal transfer printing.

16. A method for manufacturing an OLED display panel, comprising:
   forming a signal line on a first base substrate;
   forming an organic layer on the signal line;
   forming a first electrode on a surface of the organic layer which is away from the signal line;
   sequentially forming an oxidation resistant film and a meal film on one side of the first electrode which is away from the organic layer, the first electrode being a cathode of the OLED display substrate;
   forming a conductive pillar on a second base substrate; and
   aligning and bonding the first base substrate with the second base substrate by causing the conductive pillar to penetrate the organic layer to electrically connect the first electrode to the signal line, wherein the conductive pillar and the oxidation resistant film form an L-shaped member, the L-shaped member has a first surface parallel to the first base substrate and a second surface perpendicular to the first base substrate, and the L-shaped member contacts the first electrode at both the first and second surfaces, wherein an orthographic projection of the oxidation resistant film on the first substrate overlaps with an orthographic projection of the conductive pillar on the first base substrate and with an orthographic projection of the first electrode on the first base substrate.

17. The method according to claim 16, further comprising:
   forming a second electrode in the same layer as the signal line through a single patterning process, wherein the second electrode is electrically insulated from the signal line.

18. The method according to claim 17, wherein the second base substrate serves as a package cover plate of the display panel.

* * * * *